United States Patent
Olsen

(10) Patent No.: US 7,429,538 B2
(45) Date of Patent: Sep. 30, 2008

(54) MANUFACTURING METHOD FOR TWO-STEP POST NITRIDATION ANNEALING OF PLASMA NITRIDED GATE DIELECTRIC

(75) Inventor: Christopher S. Olsen, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 332 days.

(21) Appl. No.: 11/167,526

(22) Filed: Jun. 27, 2005

(65) Prior Publication Data
US 2006/0292844 A1    Dec. 28, 2006

(51) Int. Cl.
*H01L 21/31*    (2006.01)
(52) U.S. Cl. .................. 438/769; 438/786; 438/775
(58) Field of Classification Search .................. 438/769, 438/775, 786
See application file for complete search history.

(56) References Cited

U.S. PATENT DOCUMENTS

| | | | |
|---|---|---|---|
| 5,591,494 A | 1/1997 | Sato et al. | |
| 5,780,115 A | 7/1998 | Park et al. | |
| 5,939,131 A | 8/1999 | Kim et al. | |
| 6,268,267 B1 | 7/2001 | Lim | |
| 6,365,518 B1 * | 4/2002 | Lee et al. | 438/687 |
| 6,509,604 B1 | 1/2003 | Pham et al. | |
| 6,548,366 B2 * | 4/2003 | Niimi et al. | 438/384 |
| 6,548,368 B1 | 4/2003 | Narwankar et al. | |
| 6,599,807 B2 | 7/2003 | Lim et al. | |
| 6,605,511 B2 | 8/2003 | Pham et al. | |
| 6,610,614 B2 | 8/2003 | Niimi et al. | |
| 6,831,021 B2 | 12/2004 | Chua et al. | |
| 6,858,547 B2 | 2/2005 | Metzner et al. | |
| 2002/0197880 A1 | 12/2002 | Niimi et al. | |
| 2002/0197882 A1 | 12/2002 | Niimi et al. | |
| 2002/0197883 A1 | 12/2002 | Niimi et al. | |
| 2002/0197884 A1 | 12/2002 | Niimi et al. | |
| 2003/0082884 A1 | 5/2003 | Faltermeier et al. | |
| 2003/0109146 A1 | 6/2003 | Colombo et al. | |
| 2003/0111678 A1 | 6/2003 | Luigi et al. | |
| 2004/0002226 A1 | 1/2004 | Burnham et al. | |
| 2004/0038487 A1 | 2/2004 | Olsen | |
| 2004/0242021 A1 | 12/2004 | Kraus et al. | |
| 2005/0048705 A1 | 3/2005 | Burnham et al. | |
| 2005/0130448 A1 | 6/2005 | Olsen et al. | |
| 2005/0181626 A1 * | 8/2005 | Hori | 438/775 |

OTHER PUBLICATIONS

D. Ishikawa, et al. "Nitride-Sandwiched-Oxide Gate Insulator For Low Power CMOS", IEDM, 0-7803-7463-X.02, p. 869-872, IEEE.
PCT International Search Report and Written Opinion dated Sep. 26, 2007 for PCT International Application No. PCT/US2006/20508. (APPM/009715PCT).

* cited by examiner

*Primary Examiner*—Thanh Nguyen
(74) *Attorney, Agent, or Firm*—Patterson & Sheridan, LLP

(57) ABSTRACT

A method of forming a silicon oxynitride gate dielectric. The method includes incorporating nitrogen into a dielectric film using a plasma nitridation process to form a silicon oxynitride film. The silicon oxynitride film is annealed in a first ambient. The first ambient comprises an inert ambient with a first partial pressure of oxygen at a first temperature. The silicon oxynitride film is then annealed in a second ambient comprising a second partial pressure of oxygen at a second temperature. The second partial pressure of oxygen is greater than the first partial pressure of oxygen.

4 Claims, 4 Drawing Sheets

MANUFACTURING METHOD FOR TWO-STEP POST NITRIDATION ANNEALING OF PLASMA NITRIDED GATE DIELECTRIC

BACKGROUND OF THE INVENTION

1. Field of the Invention

Embodiments of the present invention generally relate to the field of semiconductor manufacturing. More specifically, the present invention relates to a method of forming a silicon oxynitride ($SiO_xN_y$) gate dielectric and integrating it into a gate stack using plasma nitridation and a two-step post plasma nitridation annealing (PNA) process.

2. Description of the Related Art

Integrated circuits are made up of literally millions of active and passive devices that function as basic components such as transistors, capacitors and resistors. A transistor generally includes a source, a drain, and a gate stack. The gate stack consists of the substrate (silicon) on top of which is grown a dielectric (usually silicon dioxide: $SiO_2$) and this is capped with an electrode (such as polycrystalline silicon).

As integrated circuit sizes and the sizes of the transistors thereon decrease, the gate drive current required to increase the speed of the transistor has increased. Because the drive current increases as the gate capacitance increases, and capacitance is inversely proportional to the gate dielectric thickness, decreasing the dielectric thickness is one method of increasing the drive current.

Attempts have been made to reduce the thickness of $SiO_2$ gate dielectrics below 20 Å. However, it has been found that the use of thin $SiO_2$ gate dielectrics below 20 Å often results in undesirable effects on gate performance and durability. For example, boron from a boron doped gate electrode can penetrate through a thin $SiO_2$ gate dielectric into the underlying silicon substrate. Also, there is typically an increase in gate leakage, i.e., tunneling, with thin dielectrics that increases the amount of power consumed by the gate. Thin $SiO_2$ gate dielectrics may be susceptible to hot carrier damage, in which high energy carriers traveling across the dielectric can damage or destroy the gate. Thin $SiO_2$ gate dielectrics may also be susceptible to negative bias temperature instability (NBTI), wherein the threshold voltage or drive current drifts with operation of the gate.

Consequently, there is a need for an alternative gate dielectric material that can be used in a large enough physical thickness to reduce current leakage density and still provide a high gate capacitance. In order to achieve this, the alternative gate dielectric material must have a dielectric constant that is higher than that of silicon dioxide. Typically, the thickness of such an alternative dielectric material layer is expressed in terms of the equivalent oxide thickness (EOT). Thus, the EOT of an alternative dielectric layer in a particular capacitor is the thickness that the alternative dielectric layer would have if its dielectric constant were that of silicon dioxide.

One method that has been used to address the problems with thin $SiO_2$ gate dielectrics is to incorporate nitrogen into the $SiO_2$ layer to form a $SiO_xN_y$ gate dielectric. Incorporating nitrogen into the $SiO_2$ layer blocks boron penetration into the underlying silicon substrate and raises the dielectric constant of the gate dielectric, allowing the use of a thicker dielectric layer.

Thermally grown silicon oxynitride has been used as gate dielectrics for several years from the 0.2 μm to 0.13 μm device generations. As the device technology has advanced from 0.2 μm to 0.1 μm the gate oxide has thinned from >25 Å to <12 Å. In order to block boron and reduce gate leakage the amount of nitrogen in the film has been increased from <3% for 25 Å $SiO_xN_y$ layers to 5-10% for 12 Å $SiO_xN_y$ layers. When nitric oxide (NO) and nitrous oxide ($N_2O$) are used to grow the oxynitride gate dielectric the nitrogen gets incorporated in the dielectric film simultaneously as the oxynitride grows, hence nitrogen is distributed evenly in the film. If NO or $N_2O$ are used to form silicon oxynitride by annealing an existing $SiO_2$ layer at elevated temperatures, the nitrogen is incorporated by growing SiON at the Si-substrate/Oxide interface. The amount of Nitrogen in the latter case (<2%) is less than in the former case (4-5%).

More recently, plasma nitridation (PN) has been used to nitride (to incorporate nitrogen into) the gate oxide. This technique results in high nitrogen concentration at the poly gate/oxide interface, which prevents boron penetration into the oxide dielectric. At the same time, the bulk of the oxide dielectric gets lightly doped with unassociated nitrogen during the plasma nitridation process, which reduces the electrical oxide thickness (EOT) over the starting oxide. This allows one to achieve a gate leakage reduction at the same EOT higher than conventional thermal processes. Scaling this dielectric in the EOT <12 Å range while preserving good channel mobility and drive current (Idsat) has been the industry challenge.

Post Nitridation Annealing (PNA) of the silicon oxynitride at high temperature has been shown as a method of improving the peak transconductance as a proxy for channel mobility, at the expense of the EOT increasing. These results are demonstrated in U.S. Patent Application Publication No. 2004/0175961, filed on Mar. 4, 2004, entitled "Two-Step Post Nitridation Annealing For Lower EOT Plasma Nitrided Gate Dielectrics," assigned to Applied Materials, Inc., which is herein incorporated by reference to the extent it does not conflict with this application.

At low pressure and high temperature, $SiO_2$ will breakdown into SiO which desorbs from the silicon surface resulting in a phenomenon called pitting.

Thus, there remains a need for an improved post anneal method for depositing a silicon oxynitride gate dielectric that has thinner EOT's with improved mobility while accounting for the problem of silicon monoxide desorption.

SUMMARY OF THE INVENTION

Embodiments of the present invention generally provide a method of forming a $SiO_xN_y$ gate dielectric. The method comprises incorporating nitrogen into a dielectric film using a plasma nitridation process to form a silicon oxynitride film. The silicon oxynitride film is then subjected to a two-step post plasma anneal. The first step involves annealing the silicon oxynitirde film in a first ambient comprising an inert ambient with a first partial pressure of oxygen at a first temperature. The second step involves annealing the silicon oxynitride film in a second ambient comprising a second partial pressure of oxygen at a second temperature wherein the second partial pressure of oxygen is greater than the first partial pressure of oxygen. In one embodiment, the first partial pressure of oxygen is between about 1 mTorr and 100 mTorr and the second partial pressure of oxygen is between about 0.1 Torr and 100 Torr.

In another embodiment, a gate electrode is deposited on the silicon oxynitride film after the two-step post plasma annealing. In one embodiment the gate electrode comprises a polysilicon film. In another embodiment, the gate electrode comprises an amorphous silicon film. In another embodiment, the gate electrode comprises a metal electrode.

Embodiments of the invention also provide a method of forming a $SiO_xN_y$ gate dielectric in an integrated processing system. A silicon substrate is introduced into a first processing chamber of the integrated processing system where a silicon dioxide film is formed on the substrate. The substrate is transferred to a second processing chamber of the integrated processing system where the substrate is exposed to a plasma comprising a nitrogen source. The substrate is then transferred to a third processing chamber of the integrated processing system where the substrate is subjected to a two-step post plasma anneal. The first step involves annealing the silicon oxynitirde film in a first ambient comprising an inert ambient with a first partial pressure of oxygen at a first temperature. The second step involves annealing the silicon oxynitride film in a second ambient comprising a second partial pressure of oxygen at a second temperature wherein the second partial pressure of oxygen is greater than the first partial pressure of oxygen. In another embodiment, the plasma nitridation process includes decoupled plasma nitridation.

In another embodiment, a $SiO_xN_y$ gate dielectric is formed by a method comprising heating a structure comprising a silicon oxide film on a silicon substrate in an atmosphere comprising $NH_3$ to incorporate nitrogen into the silicon oxide film, and then exposing the structure to a plasma comprising a nitrogen source to form a $SiO_xN_y$ gate dielectric on the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
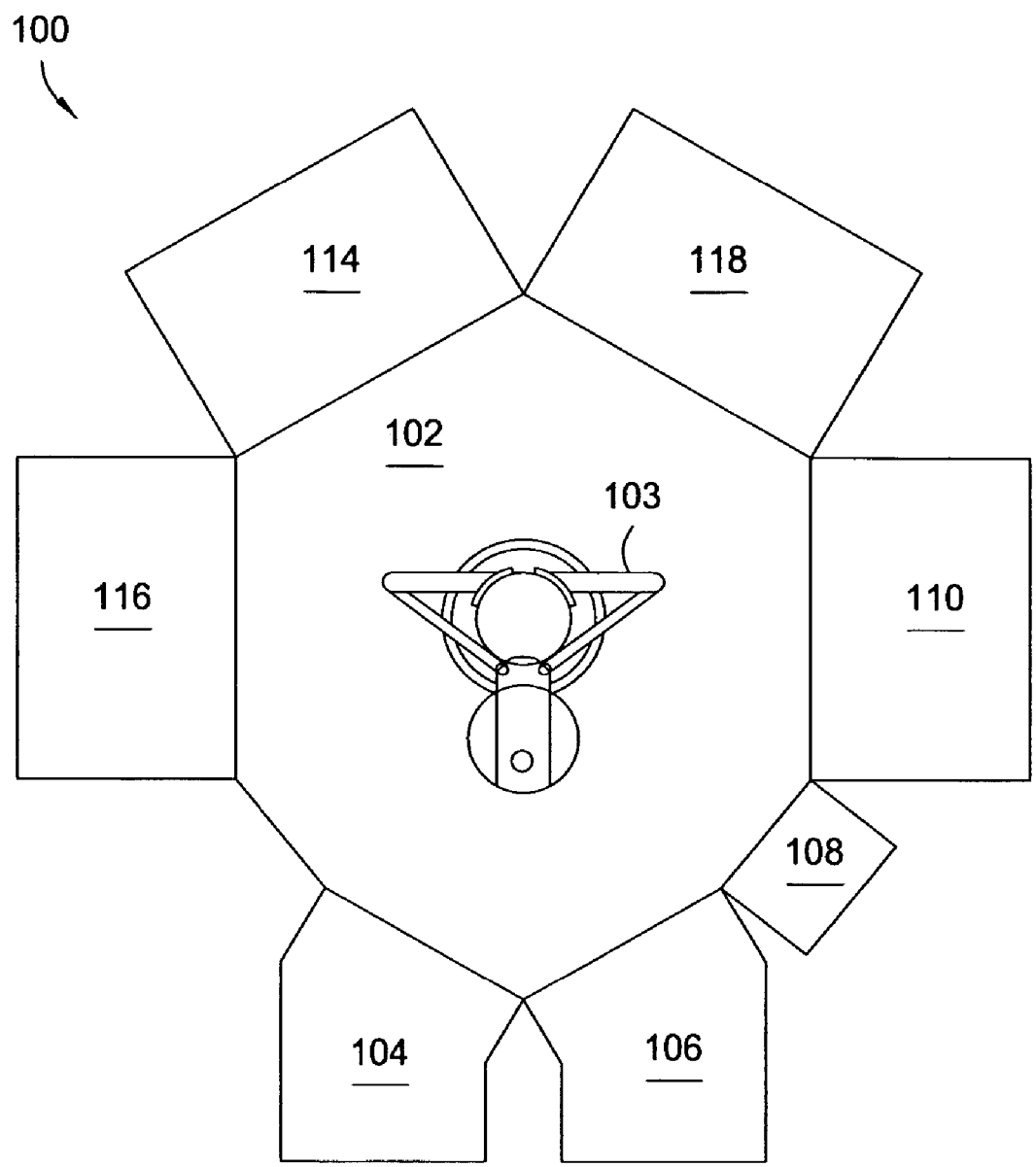
FIG. 1 is a top schematic view of an integrated processing system.

Embodiments of the invention include a method of forming a dielectric that includes nitrogen, such as SiON or $SiO_xN_y$ (silicon oxynitride) using a nitrogen plasma (or plasma nitridation) process. The silicon oxynitride is then subjected to a two-step post plasma nitridation annealing processes. The embodiments allow for the control of the EOT and the nitrogen concentration profile of the silicon oxynitride film.

In the following description, for purposes of explanation, numerous specific details are set forth in order to provide a thorough understanding of the present invention. It will be evident, however, to one skilled in the art that the present invention may be practiced without these specific details. In other instances, specific apparatus structures and methods have not been described so as not to obscure the present invention. The following description and drawings are illustrative of the invention and are not to be construed as limiting of the invention.

In one embodiment, there is provided a method of forming a silicon oxynitride dielectric film using a plasma nitridation process such as Decoupled Plasma Nitridation (DPN). After the plasma nitridation, the silicon oxynitride is subjected to a two-step post plasma nitridation annealing (PNA) process. A first PNA step is performed using an inert agent in combination with a trace amount of oxygen to densify the silicon oxynitride. A second PNA step is performed with an oxidizing agent to modify the nitrogen concentration profile. The two-step PNA process moves nitrogen towards the surface of the silicon oxynitride and the substrate thus blocking Boron more efficiently. In addition, the concentration profile of nitrogen tends to peak at the surface of the silicon oxynitride.

In another embodiment, there is provided a method of integrating the silicon oxynitride film formed using a plasma nitridation process followed by a two-step PNA process into a gate stack for forming a semiconductor device such as a transistor.

In another embodiment, a substrate having a silicon dioxide film formed thereon is subjected to a plasma nitridation process to convert the silicon dioxide film into silicon oxynitride film. In one embodiment, the plasma nitridation process used is Decoupled Plasma Nitridation (DPN), which is known in the art. DPN is a technology using inductive coupling to generate nitrogen plasma and incorporate a high level of nitrogen into an oxide film. In DPN, a surface film, e.g., an $SiO_2$ film, is bombarded with nitrogen ions which break the $SiO_2$ film forming a silicon oxynitride film. In one embodiment, DPN is performed in a chamber with pressure ranging from about 5-20 mTorr or 10-20 mTorr, with a plasma power of 200-800 Watt. The nitrogen gas may be flown into the chamber at a flow rate ranging from about 100-200 sccm. In one embodiment, the DPN uses a pulse radio frequency plasma process at about 10-20 MHz and pulse at about 5-15 kHz. The DPN process parameters can be modified depending on the chamber size and volume, and the desired thickness of the dielectric film.

Other details of the Decoupled Plasma Nitridation chamber are described in U.S. Patent Application Publication No. 2004/0242021, entitled "Method And Apparatus For Plasma Nitridation Of Gate Dielectrics Using Amplitude Modulated Radio Frequency Energy," assigned to Applied Materials, Inc., and herein incorporated by reference to the extent not inconsistent with the invention. Examples of suitable DPN chambers include the DPN Centura™, which is commercially available from Applied Materials, Inc., Santa Clara, Calif.

In one embodiment, the silicon oxynitride film is annealed twice. In the first annealing step, the silicon oxynitride is annealed to density the nitrogen concentration. The first annealing step is carried out in an inert ambient, using an inert gas such as $N_2$, He, Ar, or a combination thereof combined with a trace amount of oxygen. In one embodiment, the first annealing step is carried out immediately after the plasma nitridation process. In one embodiment, the first PNA step is performed at a temperature between about 700° C. and about 1100° C., such as a temperature between about 950° C. and 1100° C. for 1-120 seconds at a pressure ranging from about 100 mTorr to about 800 Torr with the trace amount of oxygen at a partial pressure ranging from about 1 mTorr to about 100 mTorr, such as a partial pressure between about 1 mTorr and 50 mTorr. In another embodiment, the trace amount of oxygen is at a partial pressure ranging from about 1 mTorr to about 30 mTorr. The second PNA step follows the first PNA step. In one embodiment, after the first PNA step, the annealing ambient is changed over to one which contains an oxidizing agent (or an oxygen comprising agent) such as $O_2$, $O_2/N_2$, $O_2/Ar$, $O_2/He$, $N_2O$, or NO. The second PNA step is carried out at reduced pressure ranging from about 10 mTorr to about 100 Torr and at a temperature between about 900° C. and about 1100° C. or between about 1000° C. and 1050° C. The second PNA step can be carried out for about 1-120 seconds. In one embodiment, the temperature, time, and pressure of the second PNA step are controlled to achieve a 0.1 Å to 2 Å increase in the EOT of the silicon oxynitride.

In one embodiment, both the first PNA step and the second PNA step are performed in a single wafer rapid thermal processing (RTP) chamber configured to carry out the rapid thermal annealing (RTA) process. A commercially available reduced pressure (RTP) chamber hardware such as XE, XE Plus or Radiance made by Applied Materials, Inc. can be used to carry out the first and second PNA processes.

Preferably, the $SiO_xN_y$ gate dielectric described herein comprises at least 5 atomic percent nitrogen. In one embodiment, the $SiO_xN_y$ gate dielectric comprises between about 5 atomic percent nitrogen and about 15 atomic percent nitrogen.

After the structure is exposed to the plasma and annealed, a gate electrode, such as a polysilicon layer, an amormphous silicon layer, or a metal layer may be deposited on the $SiO_xN_y$ gate dielectric to complete a gate stack.

Integrated Processing Sequence

In a further embodiment, a $SiO_xN_y$ gate dielectric may be formed on a substrate in an integrated processing system, such as an integrated semiconductor processing system, in a method in which the substrate is not removed from the integrated processing system until after the $SiO_xN_y$ gate dielectric is formed. An example of an integrated processing system 100 that may be used is the Gate Stack Centura® system, available from Applied Materials, Inc. of Santa Clara, Calif., which is shown in FIG. 1. The integrated processing system 100 includes a central transfer chamber 102, a transfer robot 103, load locks 104,106, a cool down chamber 108, a deposition chamber 110, a plasma processing chamber 114, and two rapid thermal processing (RTP) chambers 116 and 118. The deposition chamber 110 can be a conventional chemical or physical vapor deposition that can be used to form a film or a layer as is know in the art. In one embodiment, CVD processing chamber 110 is a low pressure chemical vapor deposition chamber (LPCVD), such as a POLYgen chamber, available from Applied Materials. The RTP chambers 116 and 118 are chambers that can run a rapid thermal annealing (RTA) process at a reduced or ultra-low pressure (e.g., about equal to or less than 10 Torr).

Figure 2:
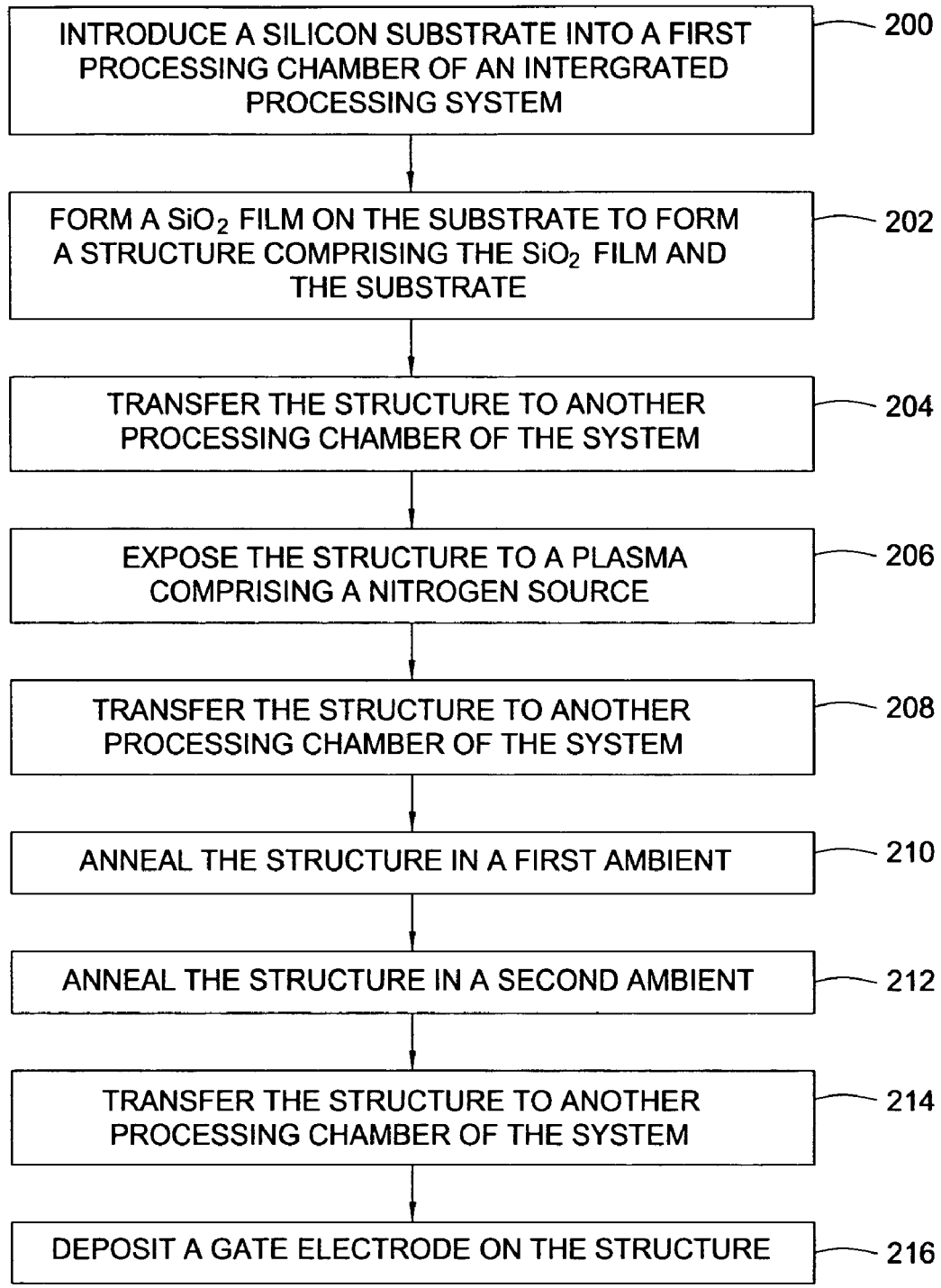
FIG. 2 is a flow chart depicting an embodiment of the invention.

In another embodiment, a substrate is introduced into an integrated processing system and a silicon oxide film, a $SiO_xN_y$ gate dielectric, and a gate electrode are deposited on the substrate without removing the substrate from the integrated processing system. This embodiment will be described below with respect to FIGS. 1 and 2.

The processing conditions for embodiments in which the $SiO_xN_y$ gate dielectric is formed in an integrated processing system are the same as the processing conditions described above for the formation of the silicon oxide film and the $SiO_xN_y$ gate dielectric. A silicon substrate is introduced into the integrated processing system 100 via a load lock 104 or 106 and placed in RTP chamber 116, where a silicon oxide film is formed on the silicon substrate, as shown in steps 200 and 202 of FIG. 2. The structure, including the substrate and the silicon oxide film is then transferred to a plasma processing chamber 114, where it is exposed to a plasma comprising a nitrogen source to incorporate nitrogen into the silicon oxide film and form the $SiO_xN_y$ gate dielectric, as shown in steps 204 and 206. The structure is transferred to RTP chamber 116 as shown in step 208 where the structure is annealed, as shown in steps 210 and 212. The structure is then transferred to CVD processing chamber 110, as shown in step 214, and a gate electrode, such as a polysilicon layer or an amorphous silicon layer is deposited on the structure, as shown in step 216. The structure is then removed from the integrated processing system 100 via a load lock 104 or 106.

In the embodiment described above with respect to FIGS. 1 and 2, the silicon oxide film is formed on the substrate in RTP chamber 116 in one step and the structure is annealed in RTP chamber 118 in another step. In an alternative embodiment, a single RTP chamber is configured to form the silicon oxide film and to also perform the two-step post plasma anneal.

In another embodiment a structure comprising a silicon dioxide film on a silicon substrate is heated in an atmosphere comprising $NH_3$ in a first processing chamber of the integrated processing system to incorporate nitrogen into the silicon oxide film. Because the substrate is exposed to an atmosphere comprising $NH_3$ within an enclosed integrated processing system, contaminating oxygen is typically not incorporated into the structure during the heating in an atmosphere comprising $NH_3$. The structure is then transferred to a second processing chamber of the integrated processing system and exposed to a plasma comprising a nitrogen source in the second processing chamber. After exposing the structure to the plasma, the structure is transferred to a third processing chamber of the integrated processing system and annealed in the third processing chamber.

It is believed that heating the structure in an atmosphere comprising $NH_3$ prior to treating the structure with a plasma comprising nitrogen smoothens the interface between the gate dielectric and the underlying silicon substrate, resulting in enhanced device performance and reliability. It is also believed that the formation of a slightly thicker oxide film by heating the structure first in an atmosphere comprising $NH_3$ prior to plasma treating the structure enhances the performance characteristics of a PMOS device.

Figure 3:
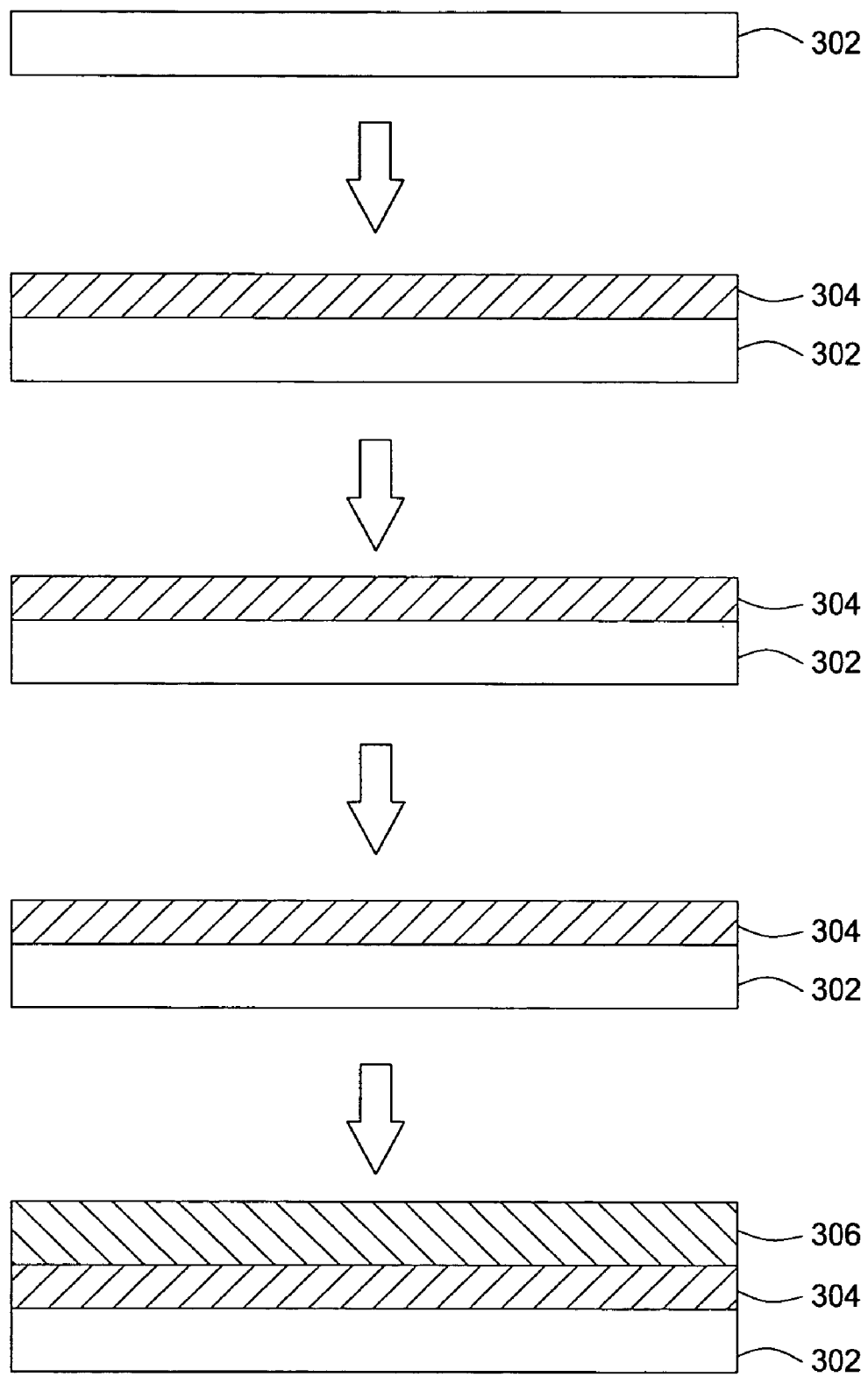
FIG. 3 illustrates an exemplary sequence of forming a gate stack in accordance with the embodiments of the present invention.

FIG. 3 illustrates an exemplary sequence of forming a gate stack in accordance with embodiments of the present invention. The substrate 302 can be a monocrystalline silicon or a semiconductor wafer typically used in making semiconductor devices. In one embodiment, the $SiO_2$ film 304 has a physical thickness of about 4-15 Å.

In one embodiment, the $SiO_2$ film 304 is grown using a reduced pressure RTP chamber such as the RTP chamber 116 of the integrated processing system 100 (FIG. 1). The $SiO_2$ film 304 is formed by a rapid thermal oxidation, which is an oxidation process where the chamber uses lamps to quickly heat and dry a substrate surface to form an oxidized layer in the presence of oxygen. The rapid thermal oxidation of a silicon substrate (or a wafer) is carried out using a dry process rapid thermal oxidation with the presence of $O_2$, $O_2+N_2$, $O_2+Ar$, $N_2O$, or $N_2O+N_2$ gas mixtures. The gas or gas mixtures can have a total flow rate of about 1-5 slm. Alternatively, the rapid thermal oxidation of a silicon substrate is carried out using a wet process such as In-Situ Steam Generation (ISSG) with the presence of $O_2+H_2$, $O_2+H_2+N_2$, or $N_2O+H_2$ having, for example, a total flow rate of about 1-5 slm with 1-13% $H_2$. In one embodiment, the rapid thermal oxidation process used to form the $SiO_2$ dielectric film is performed at a processing temperature of about 750-1000° C. and a processing pressure of about 0.5-50 Torr for about 5-90 seconds which results in an $SiO_2$ dielectric film having a thickness in the range of about 4-15 Å.

In one embodiment, after the $SiO_2$ film 304 is formed in the RTP chamber 116, the substrate 302 is transferred to the DPN chamber 114 of the integrated processing system 100 under an inert (e.g., $N_2$ or Ar) environment with the transfer chamber pressure being approximately at the same pressure for the plasma nitiridation process. The plasma nitridation process exposes the $SiO_2$ film 304 to nitrogen plasma and incorporates nitrogen into the $SiO_2$ film 304 to form a silicon oxynitride film 304. In one embodiment, the DPN chamber 114 is a reduced pressure inductively coupled RF plasma reactor that can accommodate an inert gas such as $N_2$, He, or Ar.

The silicon oxynitride film 304 is then subjected to a two-step post nitridation anneal (PNA) process in an RTP chamber, e.g. the RTP chamber 118 of the integrated processing system 100. The RTP chamber 118 can be a reduced pressure chamber reactor such as an Applied Materials reactor XE, XE Plus, or Radiance. The PNA occurs, first in a mild oxidizing ambient (inert ambient) to densify the nitrogen plasma treated film (the silicon oxynitride film 304) at a temperature of about equal to or greater than 700° C., followed by a second anneal in an oxidizing ambient at a temperature of about equal to or greater than 900° C. For the first PNA step, an inert gas (e.g., $N_2$ or Ar) with a trace amount of $O_2$ is flown into the RTP chamber to densify the silicon oxynitride film 304. In one embodiment the first PNA includes heating up the substrate having the silicon oxynitride film 304 to the appropriate annealing temperature of about equal to or greater than 700° C. at less than or equal to about 5 Torr total pressure. In one embodiment, the inert gas such as $N_2$ gas of about 1 slm is flown into the RTP chamber for about 60-120 seconds and a trace amount of oxygen is flown into the chamber at a flow rate of about 30 sccm and a pressure of about 5 Torr. Following the first PNA, the RTP chamber is evacuated of the inert gas and an oxidizing gas such as $O_2$ is flown into the RTP chamber for the second PNA. The temperature may be changed to about or greater than 900° C. The oxidizing gas is flown into the RTP chamber at about 1 slm total flow rate for about 15 seconds. It is to be appreciated that the flow rates mentioned are examples only for a particular reactor or process chamber size (e.g., a 200 mm reactor). The flow rates are proportionately adjusted (increased or decreased) for other size reactors owing to the difference in volume.

In one embodiment following the two-step PNA process, the silicon oxynitride film 304 is capped with a conductive layer such as a polysilicon film 306. The polysilicon film 306 can be formed in a deposition chamber such as the deposition chamber 110 of the integrated processing system 100 (FIG. 1). Instead of polysilicon, the film 306 can be an amorphous silicon film or other suitable conductive material. Further, metals such as titanium, titanium nitride, tantalum, tantalum nitride, tungsten, tungsten nitride, and other refractory metals or other suitable electrode materials may be deposited thereover. The deposition chamber 110 can be a low-pressure chemical vapor deposition chamber (LPCVD) that can be incorporated into the integrated processing system 100. After the formation of the polysilicon film 306, the gate stack is transferred to a cool down chamber 108 and then transferred to a storage area such as the load locks 104 and 106 for further processing, testing, or other processes known in the art.

It is to be appreciated that the gate stack that includes the gate dielectric film and the polysilicon cap film can be formed in several processing chambers not necessarily incorporated into the integrated processing system 100 previously described. For instance, the $SiO_2$ film can be formed first in one chamber. The $SiO_2$ film can be converted into silicon oxynitride in a plasma nitridation chamber. The silicon oxynitride chamber is then annealed in a two-step PNA process using an RTP chamber. And the polysilicon film is formed over a SiON or a $SiO_xN_y$ film in the same RTP chamber.

Performance of the Post Annealed $SiO_xN_y$ Gate Dielectrics

Figure 4:
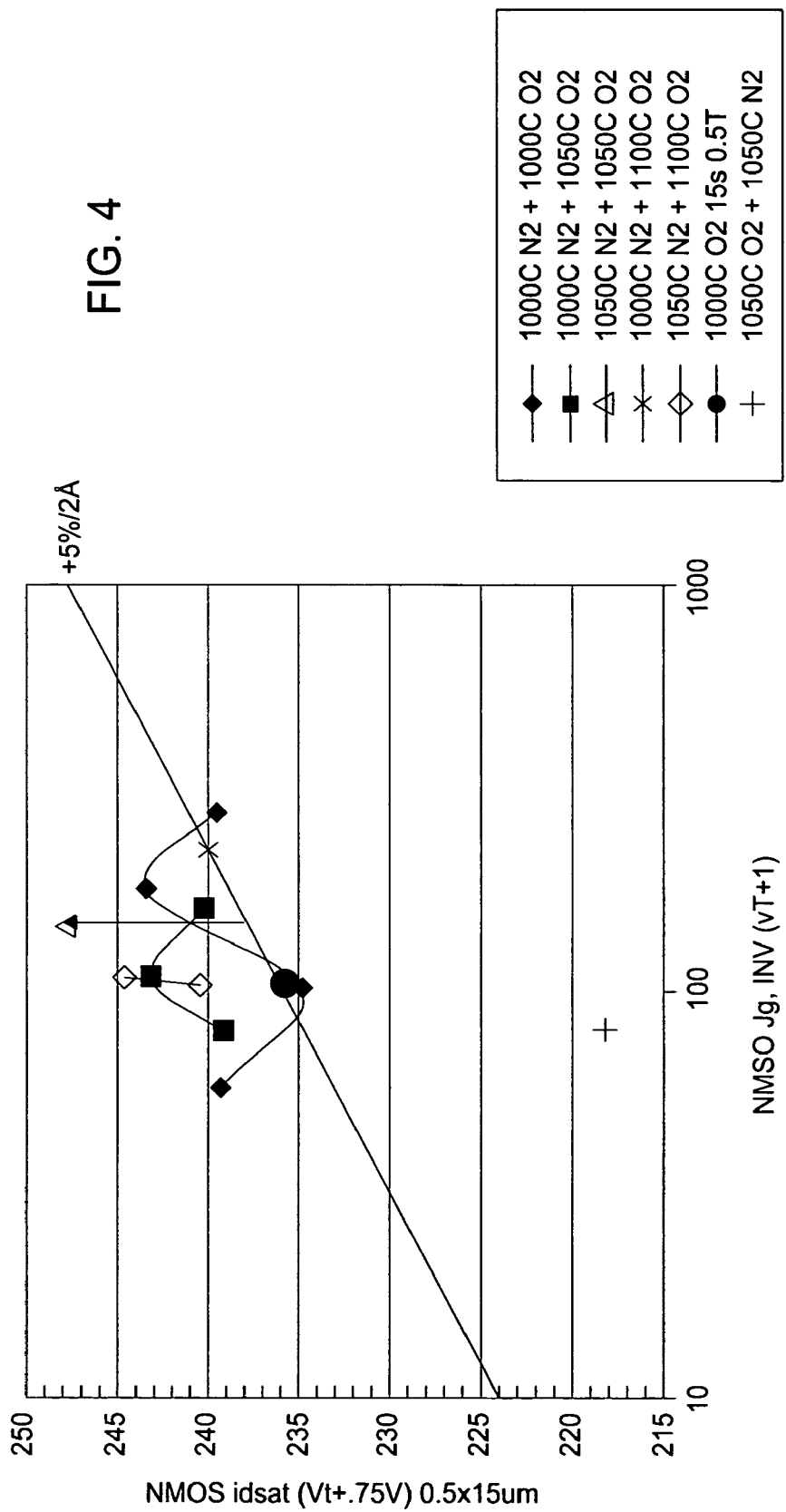
FIG. 4 is a graph showing Negative Channel Metal Oxide Semiconductor (NMOS) drive current relative to NMOS gate leakage for gate stacks comprising $SiO_xN_y$ gate dielectrics.

As shown in FIG. 4, including a trace amount of oxygen in the first step of a two-step post anneal of silicon oxynitride improves NMOS drive current relative to NMOS gate leakage. In FIG. 4, the x-axis represents NMOS gate leakage and the y-axis represents NMOS drive current. For an example, a $SiO_2$ film of about 10 Å is used as the base oxide. After plasma nitridation, various post-annealing conditions were used to anneal the film. For instance, a first step involving annealing at 1000° C. for 30 seconds at 15 mTorr partial pressure of oxygen in the presence of nitrogen gas is followed by a second step at 1000° C. for 15 seconds at 10 Torr of oxygen. In another instance, a first step involving annealing at 1000° C. for 15 seconds at 15 mTorr in the presence of nitrogen gas is followed by a second step at 1050° C. for 15 seconds at 1.5 Torr of oxygen. In another instance, a first step involving annealing at 1050° C. for 30 seconds at 15 mTorr in the presence of nitrogen gas is followed by a second step at 1050° C. for 15 seconds at 0.5 Torr. In another instance, a first step involving annealing at 1000° C. for 30 seconds at 0.015 mTorr in the presence of nitrogen gas is followed by a second step at 1100° C. for 5 seconds at 0.05 Torr. As shown in FIG. 4, the two-step post anneal containing a trace amount of oxygen in the first step exhibits a 4% improvement in NMOS Idsat over a two-step post anneal without a trace amount of oxygen in the first step.

Without intending to be limited to any particular theory of invention, it is believed that the addition of a trace amount of oxygen to the first step of the two-step post plasma nitridation anneal prevents SiO formation that will etch and damage the dielectric.

While the foregoing is directed to embodiments of the present invention, other and further embodiments of the invention may be devised without departing from the basic scope thereof, and the scope thereof is determined by the claims that follow.

The invention claimed is:

1. A method of forming a silicon oxynitride gate dielectric film, comprising:
   incorporating nitrogen into a dielectric film using a plasma nitridation process to form a silicon oxynitride film;
   annealing the silicon oxynitride film in a first ambient comprising an inert ambient with a first partial pressure of oxygen between about 1 mTorr and 100 mTorr at a first temperature ranging between about 700° C. and 1100° C.; and
   annealing the silicon oxynitride film in a second ambient comprising a second partial pressure of oxygen between about 0.1 Torr and 100 Torr at a second temperature ranging between about 900° C. and about 1100° C. wherein the second partial pressure of oxygen is greater than the first partial pressure of oxygen.

2. The method of claim 1, wherein the annealing the silicon oxynitride film in a first ambient occurs at the first partial pressure of oxygen of about 15 mTorr, at the first temperature of about 1050° C. for a first time period of about 30 seconds and the annealing the silicon oxynitride film in a second ambient occurs at the second partial pressure of oxygen of about 0.5 Torr at a second temperature of about 1050° C. for a second time period of about 15 seconds.

3. A method of forming a silicon oxynitride gate dielectric film, comprising:

providing a structure comprising a silicon dioxide film formed on a silicon substrate;

exposing the structure to a plasma comprising a nitrogen source to form a silicon oxynitride film on the substrate;

annealing the silicon oxynitride film in a first ambient comprising an inert ambient with a first partial pressure of oxygen between about 1 mTorr and 100 mTorr at a temperature ranging between about 700° C. and 1100° C.

annealing the silicon oxynitride film in a second ambient comprising a second partial pressure of oxygen between about 0.1 Torr and 100 Torr at a temperature ranging between about 900° C. and 1100° C., wherein the second partial pressure is greater than the first partial pressure; and depositing a gate electrode on the silicon oxynitride film.

4. The method of claim 3, wherein the annealing the silicon oxynitride film in a first ambient occurs at the first partial pressure of oxygen of about 15 mTorr, at the first temperature of about 1050° C. for a first time period of about 30 seconds and the annealing the silicon oxynitride film in a second ambient occurs at the second partial pressure of oxygen of about 0.5 Torr at a second temperature of about 1050° C. for a second time period of about 15 seconds.

* * * * *